United States Patent [19]
Pfaff et al.

[11] Patent Number: 5,386,472
[45] Date of Patent: Jan. 31, 1995

[54] ACTIVE NOISE CONTROL SYSTEM

[75] Inventors: Donald P. Pfaff, Mount Clemens; Nick S. Kapsokavathis, Shelby Township, Macomb County, both of Mich.

[73] Assignee: General Motors Corporation, Detroit, Mich.

[21] Appl. No.: 842,880

[22] Filed: Feb. 26, 1992

Related U.S. Application Data

[63] Continuation-in-part of Ser. No. 565,395, Aug. 10, 1990, abandoned, and a continuation-in-part of Ser. No. 620,801, Dec. 3, 1990, abandoned.

[51] Int. Cl.⁶ .................... A61F 11/06; H04R 3/02; H04B 15/00
[52] U.S. Cl. .................... 381/71; 381/73.1; 381/94
[58] Field of Search .............. 301/71, 73.1, 93, 94; 364/724.03, 724.04

[56] References Cited

U.S. PATENT DOCUMENTS

| | | | |
|---|---|---|---|
| 3,609,568 | 9/1971 | Jackson | 364/724.03 |
| 4,153,815 | 5/1979 | Chaplin et al. | 179/1 P |
| 4,468,640 | 8/1984 | Gritton | 333/166 |
| 4,473,906 | 9/1984 | Warnaka et al. | 381/73.1 |
| 4,506,380 | 3/1985 | Matsui | 381/71 |
| 4,562,589 | 12/1985 | Warnaka et al. | 381/71 |
| 4,607,528 | 8/1986 | Kallergis | 73/602 |
| 4,803,648 | 2/1989 | Diercky et al. | 364/724.19 |
| 4,805,733 | 2/1989 | Kato et al. | 181/206 |
| 4,811,261 | 3/1989 | Kobayashi et al. | 364/724.19 |
| 5,007,007 | 4/1991 | Van Zanten et al. | 364/574 |
| 5,010,576 | 4/1991 | Hill | 381/71 |
| 5,053,983 | 10/1991 | Hyatt | 364/724.04 |
| 5,222,148 | 6/1993 | Yuan | 381/71 |

FOREIGN PATENT DOCUMENTS 2069280A 8/1981 United Kingdom.

Primary Examiner—James L. Dwyer
Assistant Examiner—Jack Chiang
Attorney, Agent, or Firm—Jimmy L. Funke; Vincent A. Cichosz

[57] ABSTRACT

A active noise control system having a digital signal processor programmed to function as adaptive digital filter with an output saturation control is described. The programmed adaptive filter has a specified maximum value for its output signal, above which the output signal becomes clipped and a condition commonly known as filter output saturation occurs. According to the described system, the filter output signal value is monitored to detect the occurrence of filter output saturation. When output saturation is detected, the normal adaptation of the filter is modified to reduce the value of the filter output signal to prevent the further occurrence of filter output saturation. Based upon the detection of filter output saturation, a power reference level is established to estimate the maximum average power that the output signal can contain without causing saturation. The adaptation of filter weighting coefficients is then scaled in accordance with the difference between the established power reference level and a computed average power associated with the filter output signal to prevent the occurrence of filter output saturation.

4 Claims, 9 Drawing Sheets

ACTIVE NOISE CONTROL SYSTEM

BACKGROUND OF THE INVENTION

This application is a continuation-in-part of application Ser. No. 07/565,395 filed on Aug. 10, 1990 and application Ser. No. 07/620,801 filed on Dec. 3, 1990, in which they both are abandoned.

The invention relates to the active control of noise generated by an internal combustion engine, and more particularly, to an active noise control system which includes an adaptive filter having a specified maximum output signal value, above which filter output saturation occurs, and a control for preventing the occurrence of such output saturation.

Conventional active noise control systems attenuate undesirable noise, in the form of acoustic waves or mechanical vibrations, propagating from a noise source, by producing and superimposing noise canceling waves or vibrations, which are substantially equal in amplitude and frequency content, but shifted 180 degrees in phase with respect to the noise. Recently, this has been achieved through the use of modern digital signal processing and adaptive filtering techniques. Typically, an input sensor, such as a microphone or accelerometer, is used to measure the noise generated by the source, and to develop a sampled input signal for a digital adaptive filter. This input is transformed by the adaptive filter into a sampled output signal, which is converted into analog form and sufficiently amplified for driving a speaker or actuator to produce canceling acoustic waves or vibrations. An error sensor is employed to measure the observed residual noise level resulting from the superposition of the original noise and the canceling waves or vibrations, and develops an associated error feedback signal. This feedback signal provides the basis for modifying the parameters of the adaptive filter to minimize the level of the observed residual noise.

The active filters used in noise control systems are commonly implemented by programming digital signal processors to function according to known algorithms. These signal processors have specified maximum output values associated with their output signals, above which the output signals become clipped and distorted. This undesirable condition, commonly referred to as filter output saturation, is normally avoided by providing a system actuator or speaker of adequate size, so that the associated driving analog signal can be sufficiently amplified to completely cancel the noise, without requiring the adaptive filter to exceed its specified maximum output value.

The above described active noise control systems have been applied to attenuate different forms of noise, such as acoustic and mechanical vibrations produced by the operation of an internal combustion engine. Because the amplitude of engine generated noise can become quite substantial, depending upon the rotational speed and loading conditions on the engine, the active noise control system must produce correspondingly large canceling acoustic waves or vibrations to achieve complete noise cancellation. Usually this is not practical in engine noise applications, due to the constraints on the amount of electrical power available for amplification of the output canceling waveform, and the physical size restrictions on the output actuator or speaker used for generating the canceling vibrations or acoustic waves. For this reason, it is customary to adjust the output amplification such that the maximum output value specified for the adaptive filter corresponds to the maximum amplitude of the canceling waveform that can be applied to the system output actuator or speaker.

Consequently, when an engine generates noise at levels greater than the maximum amplitude associated with the canceling waveform, the adaptive filter will attempt to increase the value of its output signal, to minimize the observed residual noise. In doing so, the maximum output value specified for the filter will be exceeded, and filter output saturation will occur. This results in a distorted canceling waveform, which actually contributes to the residual noise level, and prevents complete noise cancellation. In addition, the clipped portions of the output canceling waveform result in large constant amplitude levels, which can damage a noise cancellation actuator, such as an audio speaker.

Consequently, there exists a need for an output saturation control for adaptive filters used in active engine noise control systems.

SUMMARY OF THE INVENTION

Active noise control systems typically include adaptive filters that have specified maximum output values, above which filter output saturation occurs. In such systems, an input signal indicative of the noise to be canceled, is generally transformed by filter weighting coefficients into the output values representing amplitude samples of an output signal used to attenuate the noise. In accord with this invention, a means is provided for controlling output saturation in adaptive filters employed in active noise control systems. This is accomplished by monitoring the value of the filter output signal to detect the occurrence of filter output saturation, and then adjusting the adaptation of the filter weighting coefficients to reduce the value of the filter output signal when filter output saturation is detected. As a consequence, the further occurrence of distortion due to the clipping of the adaptive filter output signal is avoided, and the possibility of damaging the output actuator or speaker, used by the active noise control system is eliminated.

Preferably, an average power associated with the filter output signal is computed, and a power reference level is derived to estimate the maximum average power that the output signal can contain, without causing filter output saturation. Based upon the difference between the power reference level and the computed average power, the adaptation of filter weighting coefficients is adjusted to reduce the filter output signal value, when the average power exceeds the power reference level. Thus, the present invention has the advantage that it may be realized by modifying existing software associated with an adaptive filter, without requiring any additional hardware in an active noise control system.

In the preferred embodiment of the present invention, a leaky least mean squares algorithm is used for filter adaptation. Based upon this algorithm, the filter weighting coefficients are adapted as a function of the values for a leakage coefficient term and an error signal associated with the residual noise level. By appropriately adjusting the value for the leakage coefficient and error signal during filter adaptation, it has been recognized that the value of the filter output signal can be reduced, without introducing any significant distortion. The present invention takes advantage of this feature and scales the leakage coefficient term and error signal, as a function of the difference between the derived power reference level and the computed average power associated with the filter output signal. As a result, the amplitude values of the adaptive filter output signal are reduced without adding significant distortion, when a saturation condition is detected.

In addition, the present invention is generally applicable to the control of output saturation in any adaptive filter that modifies its weighting coefficients as a function of a leakage coefficient term and an error signal term.

These and other aspects and advantages of the invention may be best understood by reference to the following detailed description of the preferred embodiment, when considered in conjunction with the accompanying drawings.

DESCRIPTION OF THE PREFERRED EMBODIMENT

Figure 1:
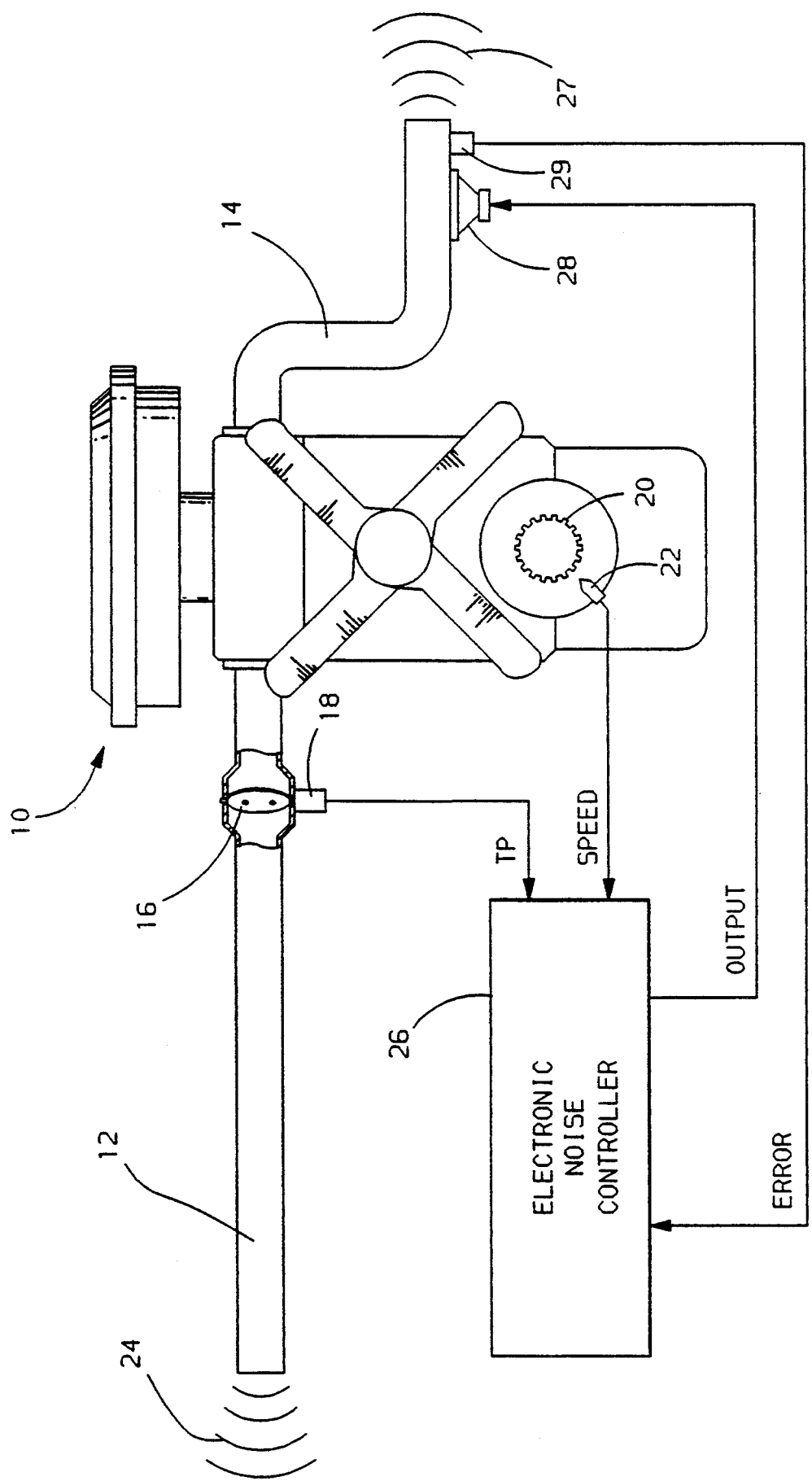
FIG. 1 is a schematic diagram of an active noise control system used to attenuate engine generated noise in accordance with the principles of the present invention.

Referring to FIG. 1, there is shown schematically an internal combustion engine, generally designated as 10, with its associated air intake system 12 and exhaust system 14. A rotatable throttle valve 16 is included within the air intake system 12 for regulating air flow to the engine 10. Also shown are two sensors generally associated with the electronic control of engine performance. The first is a standard throttle position sensor 18, such as a potentiometer, which is connected to throttle valve 16 and develops an electrical signal TP related to the degree or percent of throttle valve opening. The second is a conventional engine rotational sensor, which includes a toothed wheel 20 mounted on the engine crankshaft, and an electromagnetic sensor 22 that produces a SPEED signal having pulses corresponding to the movement of teeth on wheel 20 past electromagnetic sensor 22.

During the operation of engine 10, acoustic pressure waves are generated and propagate away from the engine through the ducts and tubes forming the air intake and exhaust systems 12 and 14. Eventually, these pressure waves propagate from openings in the intake and exhaust systems as observable engine induction noise 24 and exhaust noise 27. The engine also generates other forms of noise that are not shown in FIG. 1, such as mechanical vibrations that are transferred to the mounting structure used in supporting the engine.

Conventional active noise control systems attenuate undesirable noise propagating from a source by producing and superimposing noise canceling waves or vibrations, which are substantially equal in amplitude and frequency content, but shifted 180 degrees in phase with respect to the noise. Modernly, this is accomplished with the use of digital signal processing and adaptive filtering techniques. An input sensor is used to derive a signal indicative of the noise generated by the source, and to develop a sampled input signal for an adaptive filter. This input signal is transformed by the adaptive filter, into an output signal in the form of output sample values. These sample values are converted into an analog signal, which is then amplified to produce a canceling output waveform. The canceling output waveform drives a speaker or actuator to produce canceling waves or vibrations. An error sensor is employed to measure the observed residual noise level resulting from the superposition of the original noise and the canceling waves or vibrations, and develops an associated error feedback signal. This feedback signal provides the basis for modifying the parameters of the adaptive filter to minimize the level of the observed residual noise.

In FIG. 1, the illustrated active noise control system is applied to attenuate the exhaust noise 27 generated by engine 10. As will be described subsequently, the engine SPEED signal is directed to the electronic noise controller 26, where it is processed to derive a sample values for a signal INPUT(n), which is indicative of the frequency content in the exhaust noise produced by engine 10, with n representing the nth generated sample value.

The SPEED signal can also be used to generate other sampled inputs signals representing other types of engine generated acoustic and vibrational noise, as described more fully in the related co-pending U.S. patent application Ser. No. 07/594,495, filed Oct. 4, 1990, which is assigned to the same assignee as the present application and is hereby incorporated by reference.

It will be recognized that for the purpose of the present invention, the INPUT(n) signal may be derived from the engine SPEED sensor as shown or from any other technique known in the art for generating a signal indicative of engine rotation as a function of time. Alternatively, the INPUT(n) signal could be derived from a direct measurement of noise in the exhaust system 14, using an acoustic microphone placed upstream from speaker 28.

The amplitude of the sampled INPUT(n) signal may also be scaled (or modulated) in accordance with the magnitude of the throttle position signal TP when it proves advantageous for improving the response of the active noise control system to abrupt changes in engine loading. A brief description of this scaling procedure is provided below, with a more detailed explanation provided in the related co-pending U.S. patent application Ser. No. 07/565,395, filed Aug. 10, 1990, which is incorporated by reference.

Based upon either the scaled or unscaled sampled INPUT(n) signal, the noise controller 26 is programmed to produce an out-of-phase canceling signal waveform designated as OUTPUT. This OUTPUT signal drives cancellation speaker 28, or any other type of actuator capable of generating the canceling waves. As schematically illustrated in FIG. 1, speaker 28 is positioned with respect to exhaust system 14 in a manner well known in the art so that the canceling waves are superimposed and interfere with exhaust noise propagating within and from the exhaust system 14. Typically, an error microphone 29, or other suitable sensor, is employed to measure the level of the attenuated noise remaining after the superposition of the canceling acoustic waves, and to develop a corresponding analog ERROR feedback signal. This ERROR signal is directed to electronic noise controller 26, and provides the basis for minimizing the observed residual exhaust noise 27 propagating out of engine 10.

Figure 7:
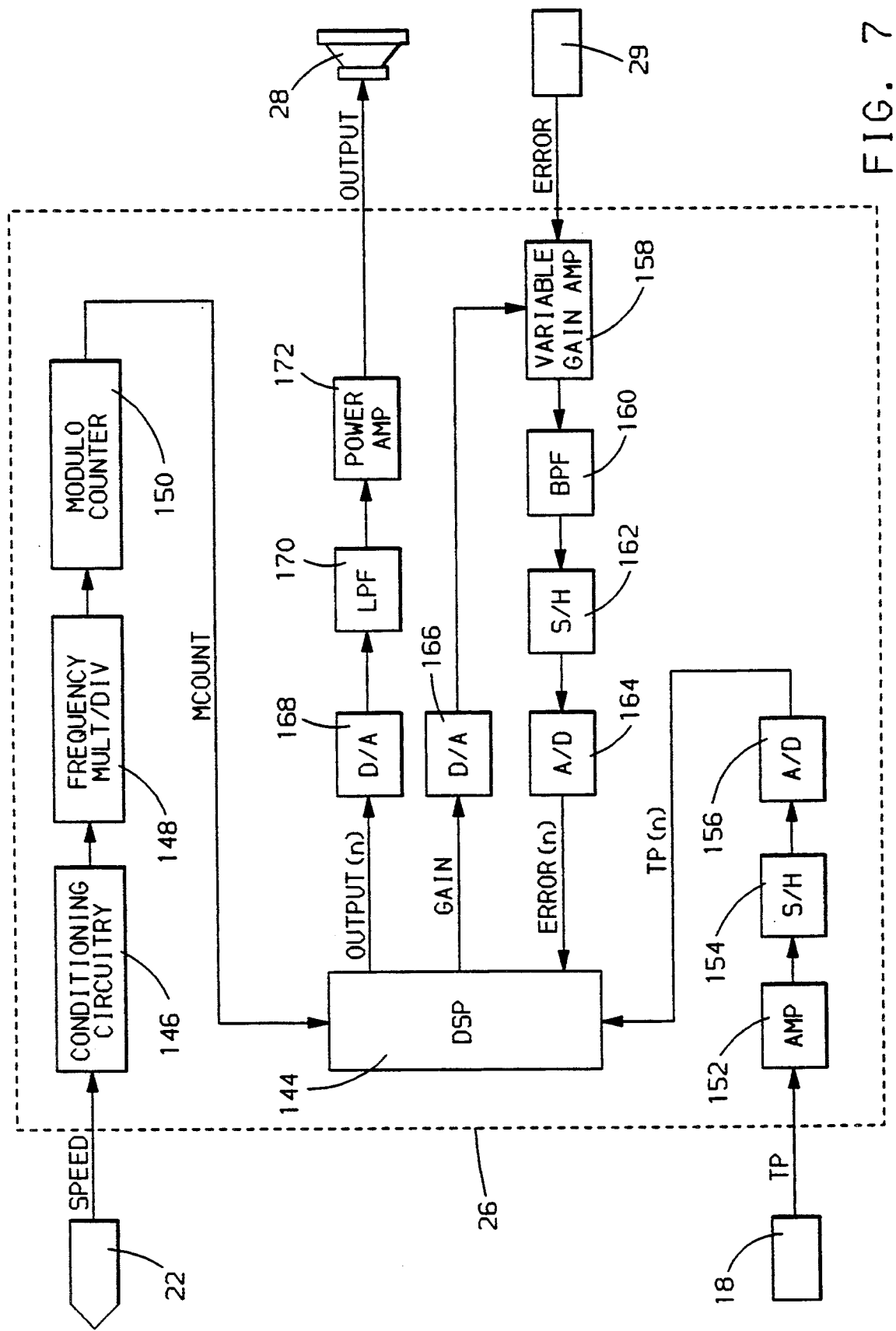
FIG. 7 is a block diagram representative of the electronic components employed in implementing the noise controller shown in FIG. 1.

Referring now to FIG. 7, the electronic circuitry within the noise controller 26 will be described in terms of a block diagram representing standard well known electronic components generally used for implementing active noise control systems. It will be recognized that the implementation shown in FIG. 7 is merely exemplary, and is not intended to limit the present invention, since other variations in the hardware implementation are possible, as evident in the numerous patents, texts, and publications addressing the subject of active noise control, see for example "Hardware and Software Considerations for Active Noise Control", M. C. Allie, C. D. Bremigan, L. J. Eriksson, and R. A. Grainier, 1988, IEEE, CH 2561-9/88/000-2598, pp. 2598–2601.

One of the principal electronic component within the preferred noise controller 26 is a digital signal processor (DSP) designated by numeral 144. Digital signal processors are commercially available, such as the Motorola 56000, and typically include a central processing unit (CPU) for carrying out instructions and arithmetic operations, random access memory (RAM) for storing data, programmable read only memory (PROM) for storing program instructions, and clock or timing circuitry used, for example, to establishing the data sampling rate at which the DSP 144 operates. For implementing active noise control systems, the DSP 144 is typically programmed to function as one or-more adaptive filters.

As described previously, an indication of the angular rotational position of the engine is preferably provided to the electronic noise controller 26 by the SPEED signal developed by the electromagnetic speed sensor 22. The SPEED signal contains pulses generated by the movement of toothed wheel 20 past electromagnetic sensor 22. After entering the noise controller 26, the SPEED signal is passed to conditioning circuitry 146, where the pulses are shaped or squared up and placed in a form generally compatible with the digital circuitry that follows. These formatted digital pulses represent a measure of the angular rotation of the crankshaft as a function of time and are passed to a standard frequency multiplier/divider circuit 148, which generates a fixed or predetermined number of pulses during one complete rotation of the engine crankshaft. The pulses from the frequency multiplier/divider 148 are then counted by a conventional modulo counter 150, to provide a digital output signal designated as MCOUNT. This digital MCOUNT signal is then provided as input to the DSP 144, and represents the degree of engine rotation through a complete engine cycle at any given time.

In general, the number of teeth on wheel 20, the frequency multiplier/divider 148, and the modulo counter 150 are selected to provide an integer value for MCOUNT ranging from 0 to a maximum value of MAX, each time the engine completes a cycle. A complete cycle in a four-stroke engine is two full revolutions of the engine crankshaft. The value of MCOUNT then represents a derived indication of the angular rotational position of the engine in an operating cycle as a function of time, or the fractional portion of an engine cycle completed at any given time. In the present application, MCOUNT reaches a MAX value of 760 before returning to 0 to restart the count. As will be described subsequently in the specification, the DSP 144 generates a signal containing the different frequency components of the engine noise to be canceled based upon the value of the input MCOUNT signal.

In addition to the SPEED signal, the other analog signals directed to the noise controller 26 are sampled at the fixed sampling rate (approximately 2.5 KHz in the present embodiment) established by the DSP 144 and digitized for further use therein. Sets of sample values for the digitized input signals are retained in the RAM memory of DSP 144 for computing sample values for a digital output signal in accordance with a programmed adaptive filter in the DSP 144. The computed samples of the digital filter output signal are then converted into analog form and appropriately amplified to drive the cancellation actuator (speaker) 28.

In what follows, digital sample values for a general time varying input or output signal z will be designated as $Z(n)$, $Z(n-1)$, $Z(n-2)$, ..., where $Z(n)$ represents the most recently obtained sample value, $Z(n-1)$ represents the second most recent sample, and so on down to the last sample value in the set retained within the memory of the DSP 144. It will be recognized by those skilled in the art that prior to storing each new value for a sampled signal, the previous value for each sample in the set is shifted downward and stored as the next earlier sample value, i.e. prior to storing a new sample value for $z(n)$, the previous value would be shifted and stored as the $Z(n-1)$ sample value, and likewise for the other samples in the set retained in DSP memory.

With regard to the other analog inputs signals directed to the DSP 144, the throttle position signal TP from sensor 18 is first passed through amplifier 152, and then converted into a digital input TP(n) for the DSP 144 by the action of sample and hold circuit 154 and analog-to-digital converter 156.

The analog ERROR signal developed by microphone sensor 29 is first amplified by a variable gain amplifier designated as 158 and then passed through a bandpass filter 160 having, for example, a pass band from approximately 20 to 700 Hz for this particular implementation. Bandpass filter 160 acts as an anti-aliasing or anti-imaging filter and removes any direct current from the amplified ERROR signal. The filtered ERROR signal is then applied to sample and hold circuit 162, which acts in conjunction with analog-to-digital converter 164 to provide digitized ERROR(n) samples of the analog ERROR signal to the DSP 144.

Based upon the sample values of the digital ERROR(n) input signal, the DSP 144 supplies a digital GAIN signal to a digital-to-analog converter 166, which in turn controls the gain of amplifier 158 to maintain the amplitude of the analog ERROR signal within upper and lower limits determined by the input capability of the sample and hold and analog-to-digital circuitry 164 and 162. This form of automatic gain control is well known and commonly used in DSP or microprocessor interfacing circuitry when digitizing an analog signal having an amplitude that can vary over a large dynamic range, such as the analog ERROR signal in the present embodiment.

Digital samples for an output noise canceling signal OUTPUT(n) are computed by the DSP 144 in accordance with the above described input signals and the characteristics of the adaptive filter programmed into the DSP 144. The digital output samples OUTPUT(n) pass to digital-to-analog converter 168, where a corresponding analog waveform is produced. The analog waveform is then passed through low pass filter 170, which has an upper cutoff frequency of approximately 700 Hz for this particular implementation. The low pass filter acts as an anti-imaging filter to remove any high frequency components introduced by the digital-to-analog conversion process. Next, the filtered analog waveform is amplified by power amplifier 172 to produce the final analog output noise canceling waveform designated as OUTPUT. This OUTPUT signal drives the cancellation actuator (speaker) 28 to produce the noise canceling waves that are superimposed with and attenuate the undesirable exhaust noise generated by engine 10.

Figure 8:
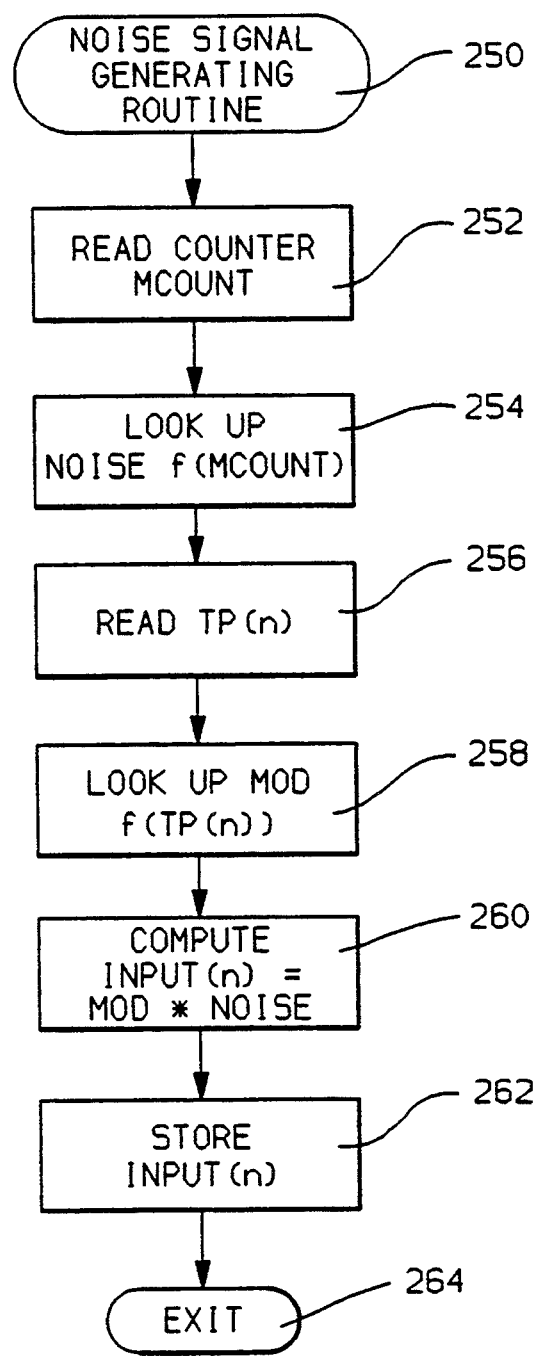
FIG. 8 is a flow diagram representative of the program steps executed by the DSP shown in FIG. 8 in deriving an input signal indicative of the undesirable engine noise that is to be canceled by the active noise control system.

Referring now to FIG. 8, there is shown a flow diagram representative of the program steps executed by the DSP 144 in the electronic noise controller 26, when deriving a signal indicative of the engine noise that is to be canceled, based upon the engine SPEED signal. Steps are also included for modulating the amplitude of that derived signal as a function of engine load in accordance with the throttle position signal TP, when it is deemed desirable.

The Noise Signal Generating Routine is entered at point 250, after each system interrupt associated with the sampling rate of the DPS 144 in the electronic noise controller 26. The program then proceeds to step 252, where the current value of MCOUNT from the previously described modulo counter 150 is read and stored.

Next at step 254, a value for NOISE, which is representative of a sample value of the undesirable engine generated noise, is looked up in a stored table, as a function of the value of MCOUNT found in the previous step 252. Stored values for the NOISE table are computed according to the following general expression:

$$\text{NOISE} = A \sin(q^*\text{MCOUNT}) + B \sin(2^*q^*\text{MCOUNT}) + C \sin(3^*q^*\text{MCOUNT}) + \ldots + M \sin(m^*q^*\text{MCOUNT}), \quad (1)$$

where, A, B, C, ..., and M represent the amplitudes of the harmonic components used in approximating the engine noise; q is a conversion constant given by $q = 2\pi/(\text{MAX}+1)$; and the integer m represents the largest harmonic (related to one-half the engine rotational speed), that is retained in the approximation. It will be understood that when the actual engine generated noise does not contain some of the above harmonics, their contribution to the NOISE values can be removed by setting their respective amplitude terms to zero.

For the purpose of computing values for the NOISE table, the amplitudes A, B, C, ..., and M of the harmonic components, which are selected for approximating the engine noise, are set equal to unity. Then values of NOISE are computed for each possible integer value of MCOUNT using the expression presented above. Prior to storage in the table, all of the calculated NOISE values are normalized to range between −1 and 1, by dividing each by the maximum NOISE magnitude computed. Alternatively, relative values for the amplitudes A, B, C, ..., and M of the noise harmonics could be found by measuring the noise to be canceled and determining an average amplitude value for each harmonic component, while running the engine on a dynamometer at different speeds over the operating range of the engine.

At step 256, the routine reads the current position of the throttle valve given by the sample value TP(n) of the analog throttle position signal TP. This value for TP(n) is stored and the program then proceeds to step 258.

At step 258, a value for MOD, the modulation factor, is looked up in a stored schedule, as a function of the current position of the throttle found in step 256. The look up schedule for the modulation factor MOD is required because the level of exhaust noise produced by an engine generally does not vary linearly with engine loading (indicated here by the position of the throttle valve), which is typically the case for engine generated air induction noise (see related co-pending U.S. patent application Ser. No. 07/565,395, filed Aug. 6, 1990).

Generally, the scheduled values for MOD will be engine dependent, but for a particular type of engine they can be determined by calibration measurements using an engine dynamometer. The value representing MOD for each particular throttle position can be found by determining the average level of exhaust noise produced, while varying engine speed over its normal operating range. All such measured average values would then be normalized prior to storage in the MOD schedule, by dividing each average value by the maximum average value found during testing. In this way, the stored values in the MOD schedule would be restricted to range between 0 and 1.

Next at step 260, a derived value for INPUT(n) is computed by multiplying the value of MOD obtained at step 258 by the sample value of the engine noise NOISE found from the look up table at step 254.

From step 260 the program proceeds to step 262, where the new value for INPUT(n) is stored in memory. Prior to storing this new value for INPUT(n), the previous value is shifted and stored as the value for INPUT(n−1), and so forth as to the other retained samples in the sequence.

The routine is then exited at step 264, with the sequence of retained values for INPUT(n) representing scaled or amplitude modulated samples of the NOISE signal that were derived from the SPEED signal to represent the undesirable noise generated by engine 10.

In some applications, it may not be desirable to scale or modulate the amplitude of the table lookup NOISE values as a function of the position of the engine throttle valve, particularly where the measured level of noise generated by the engine does not vary in a deterministic way with changes in engine loading. In this case, step 258 can be remove from the routine and the value of MOD at step 260 can be set to unity to eliminate any amplitude scaling based upon engine loading.

Figure 2:
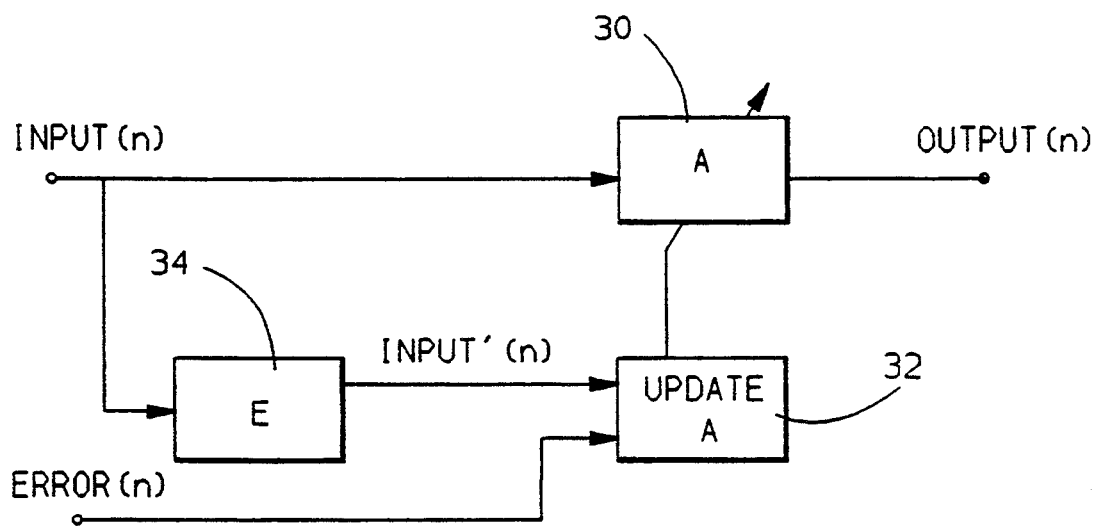
FIG. 2 is a schematic model for a filtered-X least mean squares (LMS) adaptive filter utilized by the active noise control system illustrated in FIG. 1.

Referring now to FIG. 2, the description of the adaptive filter programmed into the DSP 144 will now be described in terms of illustrated generalized block diagram, which is representative of the signal processing steps carried out within the DSP 144. Preferably, the adaptive filter is a filtered-X, leaky least mean squares (LMS) type, which is a known type of non-recursive filter adapted according to an algorithm commonly referred to as the leaky LMS algorithm. Only a brief explanation of the operation of this particular type of adaptive filter will be provided here, as a detailed description can be found in many publications and text books, such as *Adaptive Signal Processing*, B. Widrow and S. Sterns, Englewood Cliffs, N.J., Prentice-Hall, Inc., 1985, pp. 288–294.

Consecutive OUTPUT(n) sample values are produced at the system sampling rate, by adaptively filtering the most recently stored INPUT(n) sample value, and the other N−1 retained samples in the INPUT sequence, using the non-recursive digital A filter 30. New sample values for OUTPUT(n) signal are computed in accordance with the following algorithm:

$$\text{OUTPUT}(n) = \sum_{i=0}^{N-1} A_i(n) * \text{INPUT}(n - i), \quad (2)$$

where the set of $A_i(n)$ represent the most recently computed adaptive filter weighting coefficients for the A filter, and N represents the size of the filter, as well as the number of samples of the generated INPUT(n) signal retained in memory. Prior to storing each newly computed value for OUTPUT(n), the previous value is shifted and stored as OUTPUT(n−1), and so forth down to the oldest sample OUTPUT(n−N+1) retained in the sequence.

After a new sample value for OUTPUT(n) signal is computed, the adaptive filter coefficients $A_i(n)$ are updated as indicated by the UPDATE A block 32 in the diagram, in order to minimize the ERROR(n) sample value, which represent the residual engine noise remaining after the superposition of the canceling noise waveform. The UPDATE A block 32 has two inputs, the first being ERROR(n), and the second being a filtered sequence of sample values designated as INPUT' (n) derived by passing the corresponding sequence of input signal samples INPUT(n) through a fixed auxiliary E filter 34. The algorithm for updating or adapting each of the filter weights $A_i(n)$ to $A_i(n+1)$, for the next sampling interval is given by:

$$A_i(n+1) = g * A_i(n) - u * \text{ERROR}(n) * \text{INPUT}' (n-i), \quad (3)$$

where, g represents the filter leakage coefficient having a value in the range of $0 < < g < 1$, and u represents the filter convergence factor having a constant value in the range of $0 < u < < 1$. The convergence factor-u is related to rate at which the actual filter output converges to approach a desired output signal. The leakage coefficient g reduces digital quantization and round off errors when given a value slightly less than one, and thus, improves the stability of the filter. Conventionally, the values for g and u are held constant, at for example g=0.999 and u=0.03.

The sequence of sample values for the INPUT' (n) signal in equation (3) are obtained by filtering the sequence of INPUT(n) values with the fixed auxiliary E filter 34 according to the following equation:

$$\text{INPUT}'(n) = \sum_{i=0}^{N-1} E_i * \text{INPUT}(n - i), \quad (4)$$

where the set of $E_i$ represent the fixed weighting coefficients for the auxiliary E filter. As described in "An Analysis of Multiple Correlation Cancellation Loops with a Filter in the Auxiliary Path", D. R. Morgan, IEEE Transactions on Acoustic Speech Signal Processing, Vol. ASSP-28, No. 4, 1980, pp. 454–467, the auxiliary E filter 34 is used to compensate for the distortion produced by components in the error path of the active noise control system. This error path typically includes the cancellation actuator (such as speaker 28) and the associated output circuitry within noise controller 26; the error sensor 29 and the associated error input circuitry within noise controller 26; and the characteristics of the physical path, including the propagation delay time, between the cancellation actuator 28 and error sensor 29, over which the engine noise propagates.

Figure 3:
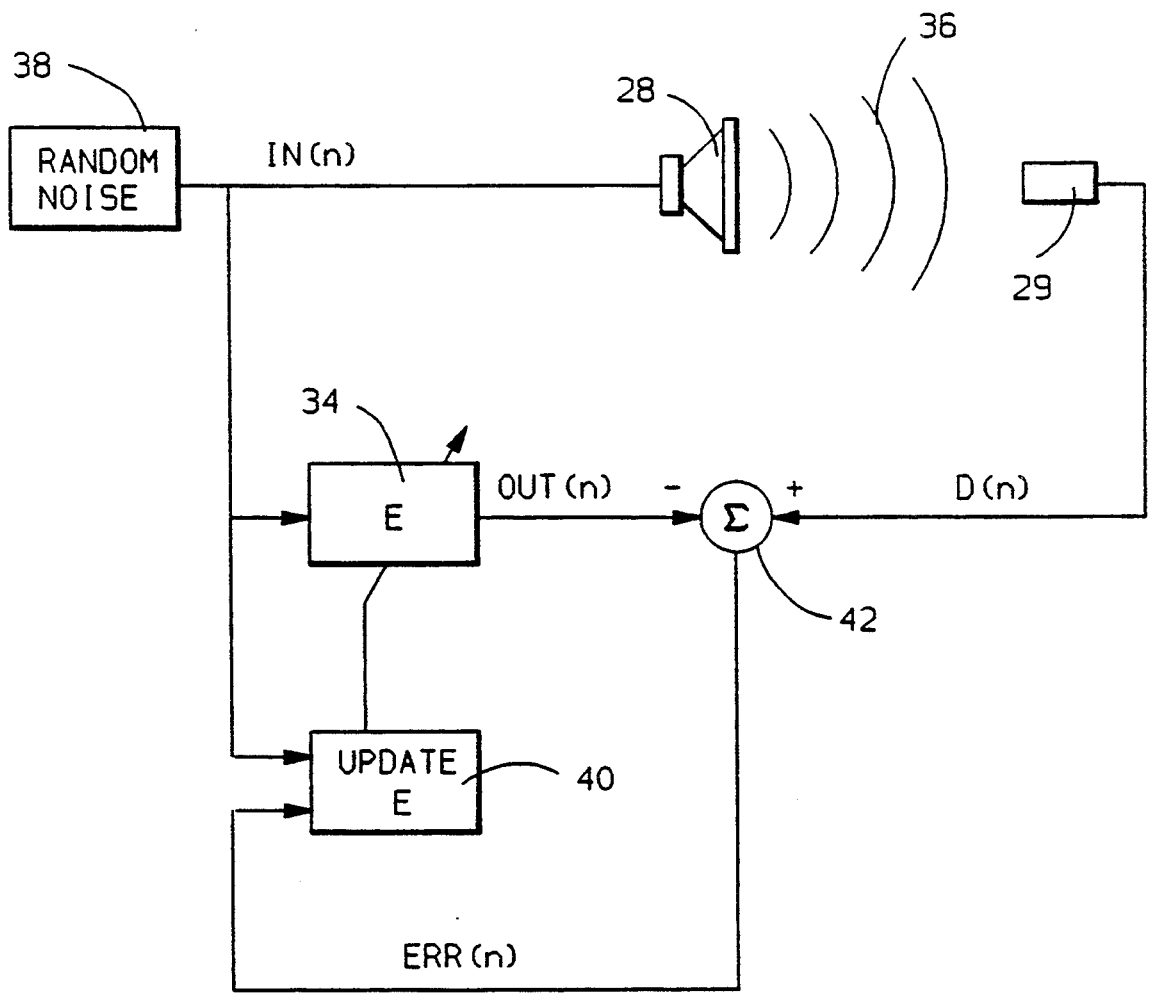
FIG. 3 is a schematic diagram representing the off-line training process for the auxiliary filter E in the adaptive filter model illustrated in FIG. 2.

Referring now to FIG. 3, there is shown a schematic diagram representing the process used in off-line training auxiliary E filter 34, to obtain the appropriate fixed weighting coefficients $E_i$. When training the E filter 34 to have a transfer function equivalent to the combined components in the error path, the cancellation actuator 28, the noise propagation path 36, and the error sensor 29 remain in the same physical locations, as when used for canceling engine exhaust noise, as shown in FIG. 1. Although not shown in the schematic representation of FIG. 3, it will be understood that the error path between the IN(n) and D(n) signals, includes the same electronic components (numbered 158–172) in the path between the OUTPUT(n) and ERROR(n) signals associated with the DSP 144 in FIG. 7.

The training process uses a conventional RANDOM NOISE SOURCE 38 to generate a sequence of random signal values designated as IN(n). The random signal samples are directed as input to the auxiliary E filter 34, and are also passed through the components of the error path to produce a corresponding sequence of samples designated as D(n). In passing over the error path, the IN(n) sample are subjected to the same components as are the OUTPUT(n) samples and the resulting ERROR(n) samples of FIG. 2.

For the training configuration shown in FIG. 3, the algorithms associated with the digital E filter 34, and its adaptation by the UPDATE E block 40, are given by:

$$\text{OUT}(n) = \sum_{i=0}^{N-1} E_i(n) * \text{IN}(n - i), \quad (5)$$

and $$E_i(n + 1) = g * E_i(n) + u * \text{ERR}(n) * \text{IN}(n - i), \quad (6)$$

where, the $E_i(n)$ represent the variable weighting coefficients for the digital E filter 34, the OUT(n) samples represent values of the filter output, and the ERR(n) samples are produced as output from summer 42 and are given by:

$$\text{ERR}(n) = D(n) - \text{OUT}(n), \quad (7)$$

where the D(n) represent the sample values derived from the error sensor 29. With this off-line training process, the weighting coefficients $E_i(n)$ of the digital E filter 34 are adaptively updated to minimize the ERR(n) values. The adaptive modeling procedure is complete, when the variable weighting coefficients $E_i(n)$ sufficiently converge to fixed values, which then correspond to the fixed weighting coefficients $E_i$ of the E filter 34. When the modeling procedure is complete, the fixed transfer function of the digital E filter 34 duplicates that of the combined components in the channel error path, and is used as illustrated in FIG. 2 to compensate for the distortion and propagation time delay introduced by components in system error path.

One practical problem encountered when attempting to implement an adaptive noise control system, as described above, is that digital signal processors, and hence their programmed adaptive filters, have a specified maximum output signal value, above which filter output saturation occurs. Consequently, when an engine generates substantially large amplitude noise levels, the noise control system attempts to produce a corresponding large amplitude canceling waveform. If the maximum specified output signal value for the adaptive filter is exceeded, the filter output signal becomes clipped. This results in incomplete cancellation of the engine generated noise, with the distorted canceling waveform actually contributing to the residual noise level. In addition, the clipped portion of the output canceling waveform results in large constant voltage levels, which can damage output actuators such as acoustic speaker 28.

The present invention is directed toward a method for controlling output saturation in an active noise control system, that employs an adaptive digital filter, which has a specified maximum output signal value. It has been found that by appropriately adjusting the magnitudes of the leakage coefficient and the error signal used during filter adaptation, the output signal samples generated by the filter can be scaled in a substantially linear fashion, to reduce their amplitude values without introducing significant distortion. Thus, by monitoring the filter output signal to detect output saturation, and then properly controlling the adaptation of the filter, the amplitude values of the filter output signal samples can be reduced to eliminate an output saturation condition. Preferably, this is accomplished by computing an average power associated with the output signal produced by the digital filter; establishing a power reference level, which estimates the maximum average power that the output signal can contain, without causing output saturation; and controlling the adaptation of the digital filter weighting coefficients, in accordance with the difference between the power reference level and the computed average power associated with the output signal.

Due to its nature, the present invention may be implemented by modifying the existing software associated with an adaptive filtering algorithm, without requiring any additional system hardware. The particulars of this method of output saturation control are described below, in terms of flow diagrams representative of the software modification programmed into electronic noise controller 26.

Figure 4A:
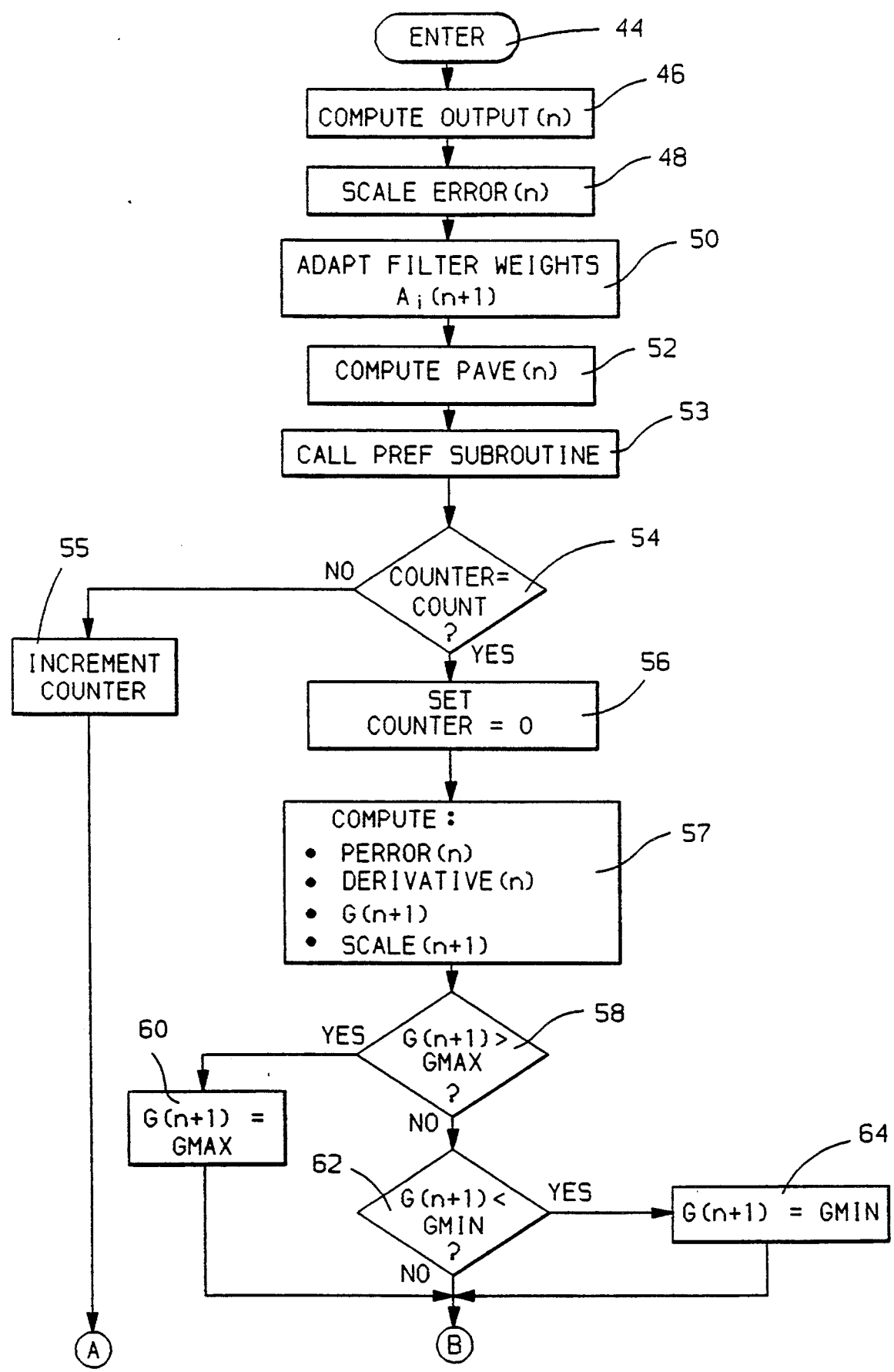
FIGS. 4a–4b is a flow diagram representative of the instructions in a routine executed by the noise controller of FIG. 1, for adapting the weighting coefficients of the digital filter model shown in FIG. 2, in accordance with the principles of the present invention.
Figure 4B:
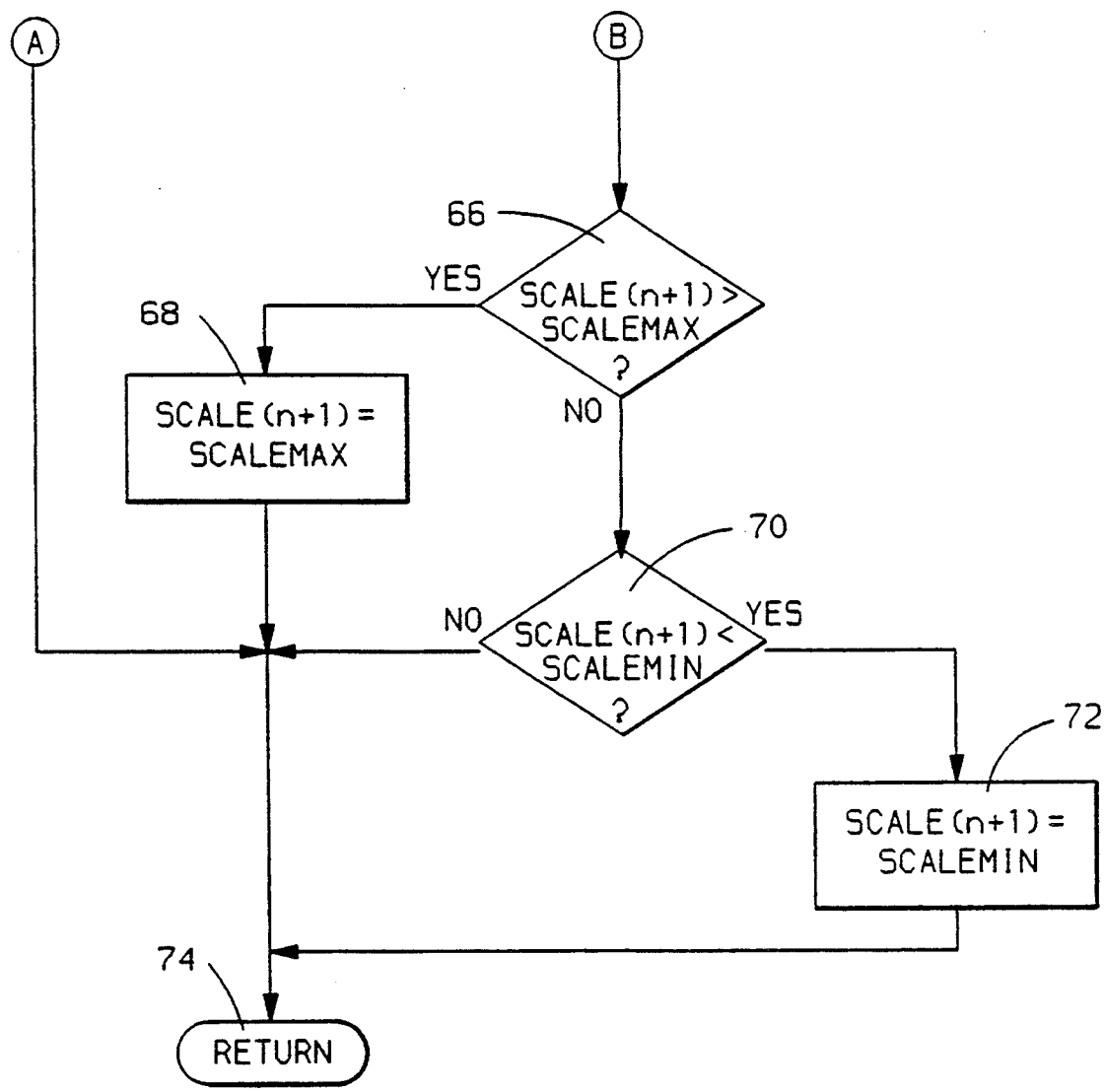

The routine illustrated by the flow diagram in FIG. 4 is part of a background loop that is continuously executed after each system interrupt associated with the sampling rate of the electronic noise controller 26 (for example, after the completion of the Noise Signal Generating Routine of FIG. 8). Prior to entering this background loop for the first time, all of the appropriate system counters, flags, and variables are properly initialized.

After the routine of FIG. 4 is entered at point 44, it proceeds to step 46, where a new value for the filter output sample OUTPUT(n) is computed according to the conventional practice using equation (2). Prior to storing this new sample value as OUTPUT(n), the previous value for OUTPUT(n) is shifted to OUTPUT(n−1), and likewise for all of the filter output samples stored in memory, down to the last retained sample OUTPUT(n−N+1).

Next, the routine proceeds to step 48, where a new scaled value for the ERROR(n) sample is obtained by multiplying its value prior to scaling, represented by ERROR(n)$_{-1}$, by a scale factor designated as SCALE(n), thus:

$$\text{ERROR}(n) = \text{ERROR}(n)_{-1} * \text{SCALE}(n), \qquad (8)$$

where SCALE(n) is initialized to a value of say 1.0, prior to the first pass through the present routine, but is thereafter modified, as described at later steps 57, and 66 through 72, each time the routine is executed.

At the next step 50, the current set of filter weighting coefficients $A_i(n)$ are adapted or updated to $A_i(n+1)$, according to the equation:

$$A_i(n+1) = G(n) * A_i(n) - u * \text{ERROR}(n) * \text{INPUT}'(n-i), \qquad (9)$$

which is basically equivalent to the conventional filter adaptation equation (3), except that the new scaled value for ERROR(n) from step 48 is used, and the traditionally constant leakage coefficient g is replaced with a variable leakage coefficient G(n).

Prior to the first pass through the present routine, G(n) is initialized to an appropriate value, for example 0.999, but thereafter, its value is modified, as described at later steps 57 through 64, each time the routine is executed. The significance of these modifications to the conventional filter adaptation equation will be more fully explained at a later point in the discussion.

The routine then proceeds to step 52, where a representation for the average power in the stored sequence of filter OUTPUT(n) signal values is computed using the following equation:

$$\text{PAVE}(n) = (1/N) \sum_{i=0}^{N-1} [\text{OUTPUT}(n-i)]^2, \qquad (10)$$

where the each output sample value is assumed to represent a voltage amplitude sample, and the power in each output sample is then given by the square of its voltage value. The average power is normalized by assuming that the voltage associated with each output value appears across a one ohm resistor.

Figure 5:
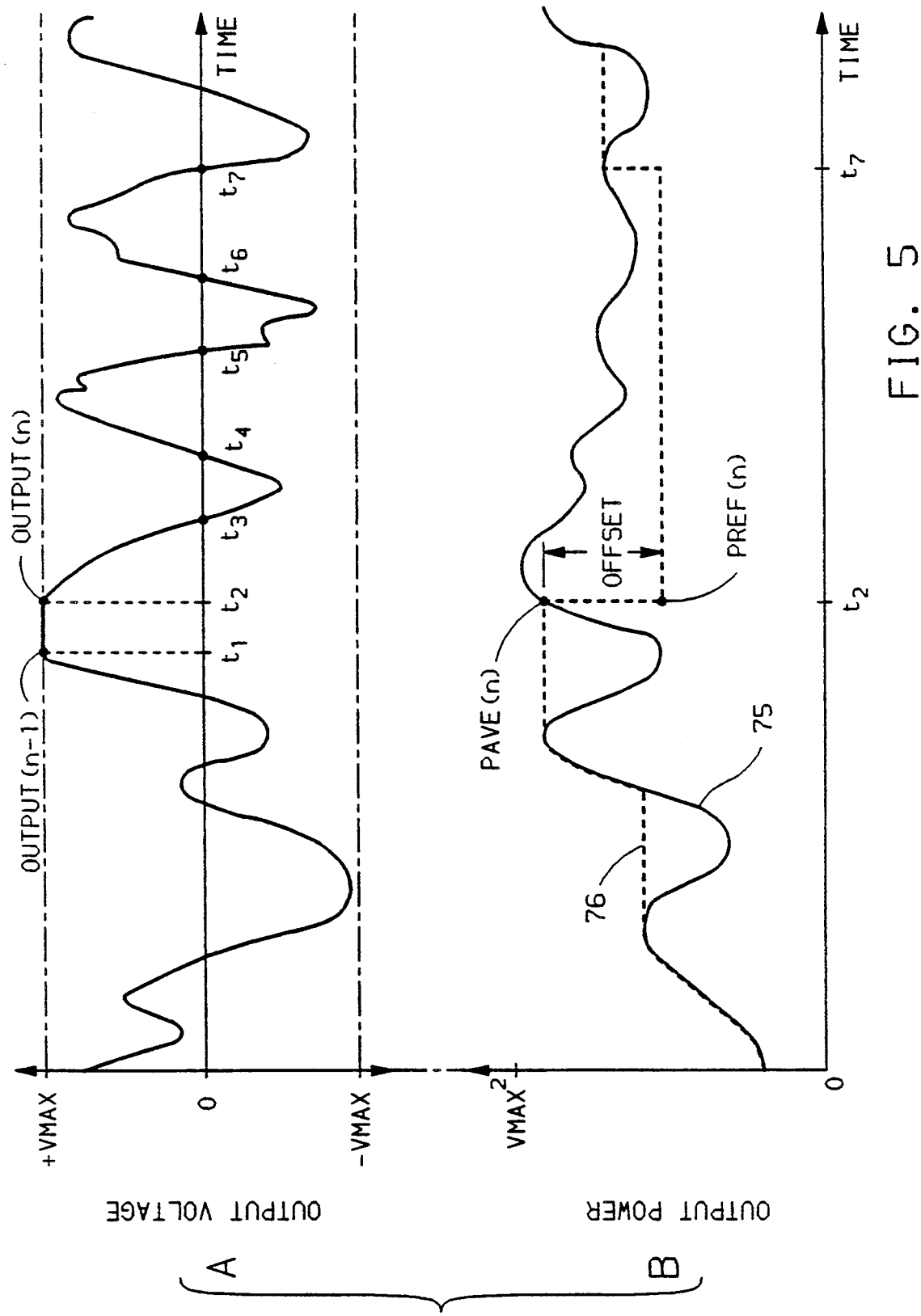
FIG. 5 graphically illustrate time variations in the voltage, average power, and a power reference level associated with the output signal of the adaptive filter model illustrated in FIG. 2.

At the next step 53, a PREF subroutine is called. This subroutine computes, and returns a value for a power reference level PREF(n), which represents the current estimate for the maximum permissible average power that can be associated with the filter output signal, without causing filter output saturation. The procedure for obtaining PREF(n), and the steps in the subroutine will be discussed when addressing FIGS. 5 and 6.

Next at step 54, the value of a COUNTER is examined to determine whether it equals COUNT. Prior to entering the routine for the first time, COUNTER will have been initialized to zero. If COUNTER does not equal COUNT, the routine proceeds to step 55, where the COUNTER is incremented by one and the routine is then exited at step 74. If COUNTER is equal to COUNT, the routine proceeds to step 56, where COUNTER is then reset to zero, before proceeding to step 57. Thus, the remainder of the routine starting at step 57, which deals with adjustments to filter adaptation, is executed only after the COUNTER has been incremented to equal COUNT. The purpose of steps 54 through 56 is to assure that a sufficient time has elapsed between any changes that are made in the filter adaptation process. In the preferred embodiment, a COUNT of 9 has been found to be sufficient, i.e. the steps starting at 57 are only executed every tenth time through the routine.

When the routine proceeds to step 57, a series of computations are completed, to update the value for the SCALE(n) variable used at step 48, and to assign a different value to the new filter leakage coefficient G(n). First, an error variable, PERROR(n), is computed as the difference between the current power reference level and the average power in the filter output, according to:

$$PERROR(n) = PREF(n) - PAVE(n). \quad (11)$$

Next, a value for the variable DERIVATIVE(n), which represents the time rate of change of PERROR(n), is computed based upon the equation:

$$DERIVATIVE(n) = PERROR(n) - PERROR(n-1). \quad (12)$$

These values for PERROR(n) and DERIVATIVE(n) are then used to compute new values for the SCALE(n) factor and filter leakage coefficient G(n), which will be used during the next pass through the routine at steps 48 and 50. The new values G(n+1) and SCALE(n+1) are found by using the equations:

$$G(n+1) = G(n) + PERROR(n)*KP + DERIVATIVE(n)*KD, \quad (13)$$

and $$SCALE(n+1) = SCALE(n) + PERROR(n)*KP + DERIVATIVE(n)*KD. \quad (14)$$

Those skilled in the control art will recognize that equations (13) and (14) take the standard form of a proportional integral derivative control scheme, where the integral feedback term is absent. In the preferred embodiment of the present invention, satisfactory performance has been achieved by setting constants KP=0.0005 and KD=0.0005. Thus, the new values for G(n+1) and SCALE(n+1) given by equations (13) and (14) are based upon the value of PERROR(n) and the rate of change in PERROR(n), where PERROR(n) represents the difference between the power reference level PREF(n) and the average power associated with the filter output PAVE(n).

When the average power in the filter output signal exceeds the power reference level, the values of SCALE(n+1) and G(n+1) are reduced in accordance with equations (13) and (14). On the next pass through the present routine, the filter weighting coefficients will be adjusted using these new reduced values for G(n) and SCALE(n) at steps 48 and 50. Accordingly, the value of the filter output signal will then be scaled down, so that output saturation does not occur. When the average power associated with the filter output signal does not exceed the power reference level, the values of SCALE(n+1) and G(n+1) can be increased to accommodate adaptive increases in the filter output, since output saturation is not presently occurring.

In adjusting filter adaptation through the use of equations (13) and (14), it has experimentally been found, that the adaptive filter used in the preferred embodiment functions best, if G(n+1) and SCALE(n+1) are restricted to specific ranges of values. In the remaining steps 58 through 72 of the routine, the values of G(n+1) and SCALE(n+1) are limited to specified maximum and minimum values.

At step 58, a decision is made as to whether the value of G(n+1) computed at step 57 is larger than a maximum permissible value GMAX. If G(n+1) is not greater than GMAX, the routine proceeds to step 62. If G(n+1) is greater than GMAX, the routine proceeds first to step 60, where G(n+1) is assigned the value of GMAX, and thereafter passes to step 66.

At step 62, a decision is made as to whether G(n+1) is less than a minimum permissible value GMIN. If G(n+1) is not less than GMIN, the routine proceeds directly to step 66. However, if G(n+1) is less than GMIN, the routine proceeds first to step 64, where G(n+1) is assigned the minimum value GMIN, and then proceeds to step 66. For the adaptive filter used in the preferred embodiment of the present invention, the best filter performance and saturation control was achieved when the GMIN and GMAX were given the approximate values of GMIN=0.992 and GMAX=0.999.

At step 66, a decision is made as to whether the value of SCALE(n+1) computed at step 57 is above a maximum permissible value SCALEMAX. If SCALE(n+1) is not greater than SCALEMAX, the routine proceeds directly to step 70. However, if SCALE(n+1) is greater than SCALEMAX, the routine proceeds first to step 68, where SCALE(n+1) is assigned the maximum value of SCALEMAX, and thereafter passes to step 74.

At step 70, a decision is made as to whether SCALE(n+1) is less than a minimum permissible value SCALEMIN. If SCALE is not less than SCALEMIN, the routine proceeds directly to step 74. If SCALE(n+1) is less than SCALEMIN, the routine proceeds first to step 72, where SCALE(n+1) is assigned the minimum value SCALEMIN, and then proceeds to step 74. In the preferred embodiment of the present invention, the approximate values of SCALEMIN=0.001 and SCALEMAX=1.0 were found to provide the best adaptive filter performance and control of output saturation.

At point 74, the routine is exited, and the remainder of the background loop programmed into electronic noise controller is completed. After the next system sampling interrupt, the present routine is again entered at point 44 to compute the next sample value for the filter OUTPUT(n) signal.

In the above routine, a PREF subroutine was called at step 53, and it returned a value for the power reference level PREF(n). This power reference level represents an estimate of the maximum value for the average power in the filter output signal, that is known not to cause output saturation. Ideally, PREF(n) should be as large as possible, without permitting the filter output to saturate. The method for obtaining a value for PREF(n) is most easily described in terms of the representative voltage and power plots versus time that are presented in FIG. 5.

FIG. 5(A) presents a continuous time representation for the filter OUTPUT(n) samples values, which are assumed to represent voltage samples. The maximum specified output value for the filter is shown as VMAX. The filter output is considered to be saturated, whenever the magnitudes of two consecutive OUTPUT(n) samples are equal VMAX. Thus, filter output saturation occurs at the indicated time $t_2$ since the magnitudes of both OUTPUT(n) and the previous sample OUTPUT(n−1) are both equal to the specified maximum output value VMAX.

As shown in FIG. 5(B), solid curve 75 provides a continuous representation of the average power associated with the filter output samples, while dotted curve 76 gives a continuous representation of the power reference level samples, determined in accordance with the present invention. Prior to filter output saturation at time $t_2$, the power reference level curve 76 assumes the maximum value attained by the average power curve 75. In this way, the power reference level tends to increase to its maximum permissible level. The detection of output saturation, at time $t_2$, indicates that the power reference level has become too large. Thus, at time $t_2$, the power reference level PREF(n) is decreased as shown in FIG. 5(B), to the current value of the average output power PAVE(n), reduced by a predetermined OFFSET amount. Once this occurs, the average power associated with the filter output exceeds the new power reference level and the adaptation of the filter weighting coefficients will be controlled accordingly, to eliminate the output saturation condition.

Once the power reference level has been decreased due to the detection of filter output saturation, it is not allowed to begin assuming the maximum value attained by the average power, for a period of time that is sufficient to assure that the saturation condition has ended. In the preferred embodiment of the present invention, this waiting period is established by counting the number of times the value of the filter output signal traverses zero, without any intervening saturation conditions. A zero crossing is considered to have occurred whenever the product of the values, for a new output sample and the immediately preceding output sample, is less than or equal to zero. It has been found that the time required for the occurrence of at least five such zero crossings has been sufficient in the preferred embodiment, to assure that the modified filter adaptation process has scaled down the filter output signal to eliminate the saturation condition, although a different number of zero crossings may perform equally well in other applications. Thus, after five zero crossings, at time $t_7$, the output saturation condition is considered to have ended, and the value for the power reference level can assume the maximum value attained by the average power associated with the filter output signal.

Figure 6A:
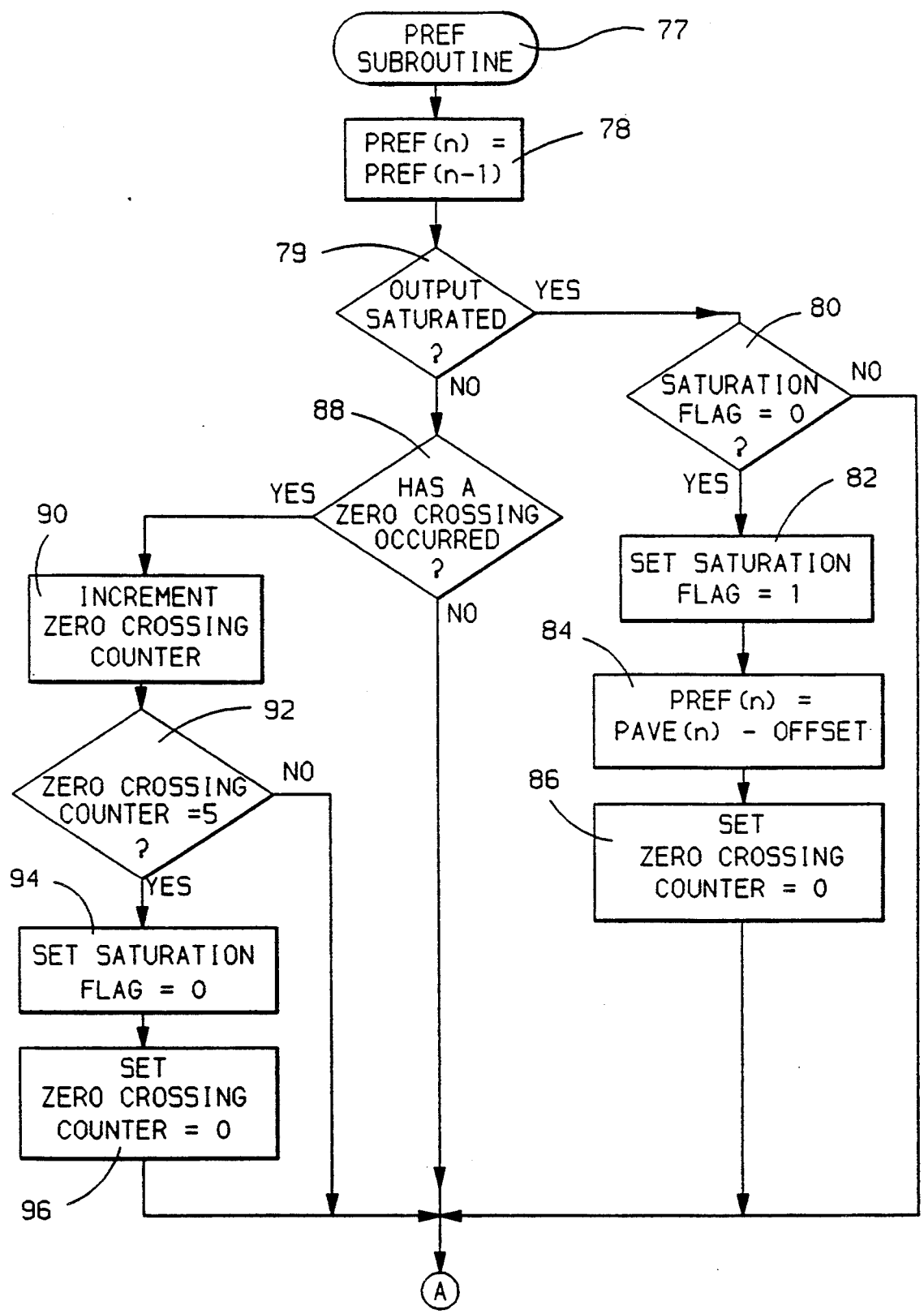
FIGS. 6a–6b is a flow diagram representative of the instructions in a subroutine PREF, which establishes a power reference level, in accordance with the principles of the present invention.
Figure 6B:
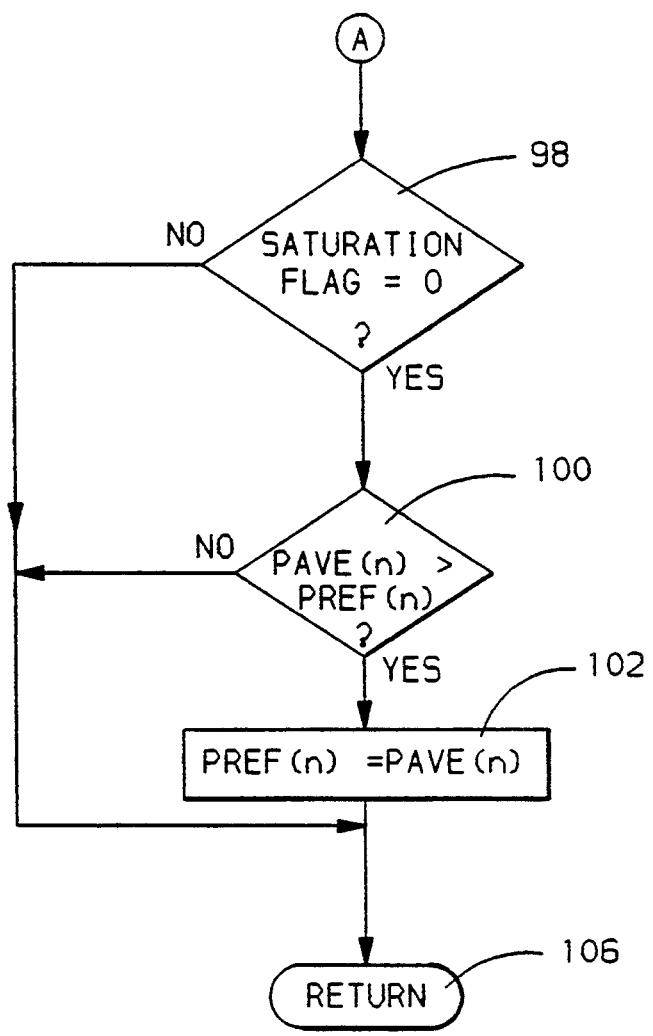

Referring now to FIG. 6, there is shown a flow diagram representing the steps within the subroutine PREF, that are executed to obtain a value for the power reference level, as described above. The PREF SUBROUTINE is entered at point 77, and proceeds to step 78.

At step 78, the PREF(n) is initially set equal to PREF(n−1), the value it had during the previous pass through the subroutine. Prior to entering the subroutine for the first time, PREF(D) will have been initialized to a value of say 0.5.

Next at step 79, a decision is required as to whether a filter output saturation condition exists. This is determined by monitoring the value of the most recent filter OUTPUT(n) sample and the previous filter OUTPUT(n−1) sample. If both OUTPUT(n) and OUTPUT(n−1) have magnitudes equal to the specified maximum output signal value for the adaptive filter, denoted in FIG. 5(A) by VMAX, then it is assumed that the filter output has been clipped to this maximum level and a saturation condition exists. If a saturation condition is detected, the subroutine proceeds from step 79, to the next decision step 80. If the filter output is not saturated, the subroutine proceeds to decision step 88.

Assuming that a saturation condition was detected at step 79, the subroutine will have proceeded to step 80. At step 80 a decision is required as to whether the saturation FLAG=0. When FLAG=1, the detected saturation condition at step 79 will be a continuation of the same saturation condition detected on an earlier pass-through the PREF SUBROUTINE, and the program will proceed to step 98. However, if FLAG=0, this indicates that the saturation condition has just occurred and the routine will pass to step 82.

At step 82, the saturation FLAG will be set to 1, indicating that a new saturation condition has just been detected.

Next at step 84, the power reference level is set equal to the current average power associated with the filter output reduced by a predetermined amount, according to:

$$\text{PREF}(n) = \text{PAVE}(n) - \text{OFFSET}. \tag{15}$$

In the preferred embodiment of the present invention, the specified maximum output value for the adaptive filter was VMAX=1.0, and in this situation, satisfactory performance was achieved by setting OFFSET=0.1 * VMAX=0.1.

Then at step 86, a ZERO CROSSING COUNTER is set equal to 0, indicating that for the new saturation condition, the value of the output signal has not yet crossed zero. The routine then proceeds to step 98.

Returning again to the decision made at step 79, if an output saturation condition was not detected, the routine will have passed to step 88. At step 88, a decision is required as to whether a zero crossing has occurred between the most recent OUTPUT(n) sample value and the previous OUTPUT(n−1) sample value. A zero crossing is considered to have occurred when the product of OUTPUT(n)*OUTPUT(n−1) is less than or equal to zero. If this product is positive, a zero crossing is considered not to have occurred and the routine proceeds to step 98. If a zero crossing has occurred, the routine passes to step 90.

At step 90, the current count of the ZERO CROSSING COUNTER in incremented by 1, to account for the zero crossing detected at step 88.

Next at step 92, a decision is required as to whether ZERO CROSSING COUNTER=5, indicating that 5 zero crossing have occurred. If the count is equal to 5, the routine proceeds to step 94. If the count of ZERO CROSSING COUNTER is not equal to 5, the routine passes to step 98.

At step 94, the saturation FLAG is set to 0, indicating 5 zero crossing have occurred, and a sufficient time has passed to consider the saturation condition ended.

Then at step 96, the ZERO CROSSING COUNTER is reset to 0, before the routine proceeds to step 98.

Now at step 98, a decision is required as to whether the saturation FLAG=0. If FLAG is not equal to 0, the routine passes to step 106. If FLAG=0, the routine proceeds to step 100.

At step 100, a decision is required as to whether the average power associated with the filter output PAVE(n) is greater than the present value for PREF(n). If PAVE(n) is not greater that PREF(n), the subroutine proceeds to step 106. However, if PAVE(n) is greater than PREF(n), the subroutine proceeds to step 102.

At step 102, PREF(n) is set equal to PAVE(n), since the PREF(n) is allowed to assume the maximum value attained by PAVE(n), as long as output saturation is not detected. After this step, the subroutine passes to step 106, where it returns a value for PREF(n) to the routine where it was called, and then proceeds to the next step in that routine, which in this case would be step 54 in the routine of FIG. 4.

Although a filtered-X, leaky least mean squares (LMS) adaptive filter has been described above as the preferred type of non-recursive adaptive filter for implementing the present invention, it will be understood that the invention can easily be adapted to any other types of adaptive filters, which have their weighting coefficients adjusted based upon an error signal and a term commonly referred to as a leakage coefficient. Those acquainted with the adaptive filter art will recognize that two different sets of weighting coefficients require adapting or updating in a recursive type adaptive filter, and the second set of weighting coefficients can be adapted in the same fashion as the first set, as described at step 50 in the routine shown in FIG. 4.

Thus, the invention is easily adapted to recursive type adaptive filters, which are typically required in active noise control systems that derive their input signals by directly measuring the noise to be canceled, with an input sensor or microphone.

It will also be recognized by those skilled in the art, that the present invention is applicable to active noise control systems that are used for canceling other forms of engine generated noise, such as mechanical vibrations or the acoustic induction noise generated by an internal combustion engine, see for example, the related U.S. patent application Ser. No. 07/594,495, filed Oct. 4, 1990.

Thus, the aforementioned description of the preferred embodiment of the invention is for the purpose of illustrating the invention, and is not to be considered as limiting or restricting the invention, since many modifications may be made by the exercise of skill in the art without departing from the scope of the invention.

The embodiments of the invention in which an exclusive property or privilege is claimed are defined as follows:

1. An active noise control system for attenuating an undesirable noise propagating from a noise source, the active noise control system including
    means for deriving an input signal representative of the undesirable noise;
    a digital signal processor programmed to operate as an adaptive filter for filtering the input signal in accordance with stored filter weighting coefficients to produce a filter output signal, the adaptive digital filter having a specified maximum filter output signal value above which filter output saturation occurs;
    actuator means for generating a noise canceling wave in response to the filter output signal and for superimposing the generated noise canceling wave with undesirable noise;
    means for sensing a residual noise level resulting from the superposition of the noise canceling wave and the undesirable noise and for developing an error signal representative thereof;
    means for adaptively adjusting the stored filter weighting coefficients based upon the error signal to reduce the sensed residual noise level;
    means for monitoring the filter output signal and for detecting the occurrence of filter output saturation based upon monitored values of the filter output signal; and
    means for modifying the adaptive adjustment of the stored filter weighing coefficients to decrease the value of the filter output signal in response to detecting the occurrence of filter output saturation.

2. An active noise control system for attenuating an undesirable noise propagating from a noise source, the active noise control system including
    means for deriving an input signal representative of the undesirable noise;
    a digital signal processor programmed to operate as an adaptive filter for filtering the input signal in accordance with stored filter weighing coefficients to produce a filter output signal, the adaptive digital filter having a specified maximum filter output signal value above which filter output saturation occurs;
    actuator means for generating a noise canceling wave in response to the filter output signal and for superimposing the generated noise canceling wave with undesirable noise;
    means for sensing a residual noise level resulting from the superposition of the noise canceling wave and the undesirable noise and for developing an error signal representative thereof;
    means for adaptively adjusting the stored filter weighing coefficients based upon the error signal to reduce the sensed residual noise level;
    means for monitoring the filter output signal and for detecting the occurrence of filter output saturation based upon monitored values of the filter output signal; and
    means for computing an average power value for the filter output signal;
    means for estimating a power reference level, which represents a maximum for the average power value without the occurrence of filter output saturation; and
    means for modifying the adaptive adjustment of the stored filter weighing coefficients to decrease the filter output signal value in response to detecting the occurrence of filter output saturation based upon the difference between the power reference level and the computed average power value, when the computed average power exceeds the power reference level.

3. The active noise control system of claim 2, wherein the means for estimating a power reference level includes:
    means for monitoring the filter output signal to determine when the specified maximum filter output value is exceeded;
    means for setting the power reference level equal to (A) the computed average power value, when the specified maximum filter output value is not exceeded, and (B) the computed average power value reduced by a predetermined amount for a period of time defined by the occurrence of a defined number of zero-crossings of the filter output signal, when the specified maximum filter output value has been exceeded.

4. The active noise control system of claim 3, wherein:

the filter weighing coefficients are adaptively adjusted in accordance with a modified leaky least mean squares algorithm based upon a filter leakage coefficient value and the error signal; and the means for modifying the adaptive adjustment of the stored filter weighing coefficients includes means for scaling the magnitude of the leakage coefficient value and the error signal based upon the difference between the power reference level and the computed average power value.

* * * * *